United States Patent
Gaynes et al.

(10) Patent No.: US 9,321,245 B2
(45) Date of Patent: Apr. 26, 2016

(54) INJECTION OF A FILLER MATERIAL WITH HOMOGENEOUS DISTRIBUTION OF ANISOTROPIC FILLER PARTICLES THROUGH IMPLOSION

(71) Applicant: GLOBALFOUNDRIES INC., Grand Cayman (KY)

(72) Inventors: Michael A. Gaynes, Vestal, NY (US); Eric P. Lewandowski, White Plains, NY (US); Jae-Woong Nah, New York, NY (US); Robert J. Polastre, Cold Spring, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 60 days.

(21) Appl. No.: 13/925,050

(22) Filed: Jun. 24, 2013

(65) Prior Publication Data

US 2014/0377571 A1    Dec. 25, 2014

(51) Int. Cl.

| | |
|---|---|
| *B05D 5/12* | (2006.01) |
| *B32B 9/00* | (2006.01) |
| *H05K 5/06* | (2006.01) |
| *B05D 3/04* | (2006.01) |
| *B32B 37/10* | (2006.01) |
| *H01L 23/00* | (2006.01) |
| *H05K 3/24* | (2006.01) |
| *H05K 3/34* | (2006.01) |

(52) U.S. Cl.
CPC ............... *B32B 9/00* (2013.01); *B05D 3/0406* (2013.01); *B32B 37/1018* (2013.01); *H01L 24/29* (2013.01); *H01L 24/75* (2013.01); *H05K 5/065* (2013.01); *H01L 2224/16225* (2013.01); *H01L 2224/32225* (2013.01); *H01L 2224/73204* (2013.01); *H01L 2224/92125* (2013.01); *H05K 3/24* (2013.01); *H05K 3/341* (2013.01)

(58) Field of Classification Search
USPC ................................ 427/96.2–96.6, 294, 348
See application file for complete search history.

(56) References Cited

U.S. PATENT DOCUMENTS

| | | | |
|---|---|---|---|
| 4,545,926 A | | 10/1985 | Fouts, Jr. et al. |
| 4,568,592 A | * | 2/1986 | Kawaguchi et al. .......... 428/107 |

(Continued)

OTHER PUBLICATIONS

Office Action dated Sep. 24, 2014 received in U.S. Appl. No. 14/024,687.

(Continued)

*Primary Examiner* — Brian K Talbot
(74) *Attorney, Agent, or Firm* — Scully, Scott, Murphy & Presser, P.C.

(57) ABSTRACT

A method for providing a matrix material between a bonded pair of substrates with a homogeneous distribution of anisotropic filler particles is provided. Functionalized anisotropic filler particles are mixed uniformly with a matrix material to form a homogenous mixture. A bonded assembly of a first substrate and a second substrate with an array of electrical interconnect structures is placed within a vacuum environment. The homogenous mixture of the matrix material and the anisotropic filler particles is dispensed around the array of electrical interconnect structures. A gas is abruptly introduced into the vacuum environment to induce an implosion of the homogenous mixture. The implosion causes the homogenous mixture to fill the cavity between the first and second substrates without causing agglomeration of the anisotropic filler particles. The mixture filling the space between the first and second substrates has a homogenous distribution of the anisotropic filler particles.

16 Claims, 6 Drawing Sheets

(56) References Cited

U.S. PATENT DOCUMENTS

| | | | |
|---|---|---|---|
| 5,203,076 A * | 4/1993 | Banerji et al. | 29/840 |
| 5,431,571 A | 7/1995 | Hanrahan et al. | |
| 5,804,882 A | 9/1998 | Tsukagoshi et al. | |
| 5,866,442 A * | 2/1999 | Brand | 438/108 |
| 5,998,242 A * | 12/1999 | Kirkpatrick et al. | 438/127 |
| 6,199,751 B1 | 3/2001 | Gaynes et al. | |
| 6,255,142 B1 * | 7/2001 | Babiarz et al. | 438/126 |
| 6,559,666 B2 | 5/2003 | Bernier et al. | |
| 6,589,601 B1 * | 7/2003 | Shimada | 427/348 |
| 6,844,052 B2 | 1/2005 | Jiang | |
| 7,119,449 B2 | 10/2006 | Workman et al. | |
| 7,312,534 B2 | 12/2007 | Delos Santos et al. | |
| 7,348,298 B2 | 3/2008 | Zhang et al. | |
| 7,479,516 B2 | 1/2009 | Chen et al. | |
| 7,482,201 B2 | 1/2009 | Charles et al. | |
| 7,547,579 B1 * | 6/2009 | Jiang | 438/118 |
| 7,594,805 B2 | 9/2009 | Miyakawa et al. | |
| 7,619,318 B2 | 11/2009 | Rumer et al. | |
| 7,781,260 B2 | 8/2010 | Sane et al. | |
| 8,129,230 B2 | 3/2012 | Gaynes et al. | |
| 8,166,645 B2 | 5/2012 | Wilcoxon et al. | |
| 8,609,462 B2 * | 12/2013 | Chen | H01L 21/50 257/E21.499 |
| 2002/0167804 A1 | 11/2002 | Towle | |
| 2004/0047127 A1 * | 3/2004 | Yamauchi et al. | 361/688 |
| 2004/0241262 A1 * | 12/2004 | Huey et al. | 425/110 |
| 2008/0249221 A1 | 10/2008 | Corkery et al. | |
| 2008/0299300 A1 | 12/2008 | Wilcoxon et al. | |
| 2009/0086446 A1 * | 4/2009 | Sugimoto | H05K 3/284 361/752 |
| 2009/0230566 A1 * | 9/2009 | Hisada | H01L 21/563 257/778 |
| 2010/0295173 A1 | 11/2010 | Chang et al. | |
| 2011/0122590 A1 * | 5/2011 | Wilson et al. | 361/760 |
| 2011/0156255 A1 | 6/2011 | Wyland et al. | |
| 2011/0214284 A1 | 9/2011 | Xu et al. | |

OTHER PUBLICATIONS

Zheng, X. et al., "A Strategy for Dimensional Percolation in Sheared Nanorod Dispersions" Advanced Materials (Oct. 31, 2007) pp. 4038-4043, vol. 19, No. 22.

Gojny, F.H. et al., "Carbon nanotube-reinforced epoxy-composites: enhanced stiffness and fracture toughness at low nanotube content" Composites Science and Technology (Nov. 2004) pp. 2363-2371, vol. 64, No. 15.

Bug, A.L. et al., "Continuum Percolation of Rods" Physical Review Letters (Apr. 1, 1985) pp. 1412-1415, vol. 54, No. 13.

Imanaka, M. et al., "Fracture toughness of spherical silica-filled epoxy adhesives" International Journal of Adhesion & Adhesives (Nov. 5, 2001) pp. 389-396, vol. 21, No. 5.

Thostenson, E.T. et al., "Processing-structure-multi-functional property relationship in carbon nanotube/epoxy composites" Carbon (Nov. 2006) pp. 3022-3029, vol. 44, No. 14.

Hobbie, E.K., "Shear rheology of carbon nanotube suspensions" Rheol Acta (Apr. 2010) pp. 323-334, vol. 49, No. 4.

Tang, L.C. et al., "Fracture mechanisms of epoxy filled with ozone functionalized multi-wall carbon nanotubes" Composites Science and Technology (Dec. 6, 2011) pp. 7-13, vol. 72, No. 1.

Rahatekar, S.S. et al., "Length-Dependent Mechanics of Carbon-Nanotube Networks" Advanced Materials (Feb. 23, 2009) pp. 874-878, vol. 21, No. 8.

International Search Report dated Sep. 2, 2014, received in a corresponding foreign application.

Schwiebert, M. K. et al., "Underfill Flow as Viscous Flow Between Parallel Plates Driven by Capillary Action", IEEE Transactions on Components, Packaging, and Manufacturing Technology, Part C. Apr. 1996, vol. 19, No. 2, p. 136.

* cited by examiner

INJECTION OF A FILLER MATERIAL WITH HOMOGENEOUS DISTRIBUTION OF ANISOTROPIC FILLER PARTICLES THROUGH IMPLOSION

BACKGROUND

The present disclosure relates to methods of dispensing a matrix material with homogeneous distribution of anisotropic filler particles through implosion, and structures generated by the same.

Anisotropic filler particles can serve a useful function when embedded within a matrix of another material. For example, conductive anisotropic filler particles embedded within a matrix of an insulating material can provide conductive paths through the insulating material through percolation of the distributed conductive anisotropic filler. Thermally conductive paths or electrically conductive paths can be provided through the matrix of the insulating material. Further, the anisotropic filler particles can add to the mechanical strength of the matrix.

The volume fraction of the anisotropic filler particles needed to provide percolation paths throughout the entirety of the matrix depends on the orientational anisotropy that the anisotropic filler particles provide. The orientational anisotropy depends largely on the ratio of the longest dimension of an anisotropic filler particle to the shortest dimension of the anisotropic filler particle, as well as the precise shape of the anisotropic filler particle.

In general, the greater the orientational anisotropy of the anisotropic filler particle, the less volume fraction is required to provide percolation paths within the matrix. In an illustrative example, in case anisotropic filler particles are shaped like cylindrical rods and have an aspect ratio (defined by the ratio of the length of a cylindrical rod to the diameter of the cylindrical rod) of about 500, a volume fraction of about 0.001 (i.e., 0.1% of the entire volume of the matrix) is sufficient to provide a connected network of percolation paths within the matrix. If the aspect ratio is about 200, anisotropic filler particles having a volume fraction of about 0.002 can provide a connected network of percolation paths within the matrix. If the aspect ratio is about 100, anisotropic filler particles having a volume fraction of about 0.005 can a connected network of percolation paths within the matrix. The number for a required volume fraction for providing a connected network of percolation paths can change as the shapes of the anisotropic filler particles changes (for example, into a disk).

While initial dispersions of anisotropic particles in a matrix are possible via many means of agitation, common dispensing techniques for dispersing such a dispersion into confined geometries leads to flow induced aggregation. A mechanism for such aggregation is illustrated in FIG. 1. Specifically, FIG. 1 illustrates a volume extending along the x and y direction (the y direction is perpendicular to the plane of the page) without boundaries and confined in the z direction between the z coordinates of $z_0$ and $z_1$. Injection of fluid typically results in a laminar flow with a non-uniform velocity field (illustrated with straight arrows) because the velocity of the fluid is zero at the horizontal planes of $z=z_0$ and $z=z_1$. Such non-uniform velocity field generates flow-induced rotation of particles embedded within the fluid. The greater the orientational anisotropy of the anisotropic filler particles within the fluid, the greater the rotation of the anisotropic filler particles. The rotation of the anisotropic filler particles induces physical contacts among the anisotropic filler particles, and results in agglomeration of the anisotropic filler particles.

Because the rate of agglomeration of the anisotropic filler particles increases with the amount of agglomerated anisotropic filler particles, the density of agglomerated anisotropic filler particles increases with distance from the injection point, which is represented by the vertical plane x=0. Agglomerated anisotropic filler particles can easily make physical contact with the boundaries (which are present at the horizontal planes of $z=z_0$ and $z=z_1$) and effectively precipitate out of the fluid once stuck at one of the boundaries. This phenomenon results in a non-uniform density of the agglomeration as a function of the distance (the value of x) from the injection point. Further, a non-uniform density of the anisotropic filler particles as a function of the distance from the injection point is present within the volume in which the injected fluid is present as illustrated in FIG. 2.

Injection of a matrix material including anisotropic filler particles into a volume between two bonded substrates faces the problem of agglomeration of the filler particles. For this reason, attempts to inject anisotropic filler particles at a density sufficiently high to provide a network of percolation paths resulted in non-homogeneous distribution of anisotropic filler particles in the past.

BRIEF SUMMARY

A method for providing a matrix material between a bonded pair of substrates with a homogeneous distribution of anisotropic filler particles is provided. Functionalized anisotropic filler particles are mixed uniformly with a matrix material to form a homogenous mixture. A bonded assembly of a first substrate and a second substrate with an array of electrical interconnect structures is placed within a vacuum environment. The homogenous mixture of the matrix material and the anisotropic filler particles is dispensed around the array of electrical interconnect structures. A gas is abruptly introduced into the vacuum environment to induce an implosion of the homogenous mixture. The implosion causes the homogenous mixture to fill the cavity between the first and second substrates without causing agglomeration of the anisotropic filler particles. The mixture filling the space between the first and second substrates has a homogenous distribution of the anisotropic filler particles.

According to an aspect of the present disclosure, a method of disposing a mixture of a matrix material and anisotropic filler particles into a volume is provided. A structure is provided, which includes a contiguous volume located between two surfaces and bounded by the two surfaces vertically spaced from each other. A mixture is provided, which includes a matrix material and anisotropic filler particles that are homogeneously mixed within the matrix material. The structure is disposed within a vacuum-tight enclosure. A vacuum environment is provided within the vacuum-tight enclosure while the structure is present within the vacuum-tight enclosure. The mixture is applied within the vacuum environment around a periphery of the contiguous volume and on at least one of the two surfaces. The applied mixture is imploded into the continuous volume introducing a gas into the vacuum-tight enclosure. The introduced gas causes the applied mixture to fill the contiguous volume with a homogeneous distribution of the anisotropic filler particles within the matrix material.

According to another aspect of the present disclosure, a structure is provided, which includes a first substrate and a second substrate that are bonded to each other through an array of electrical interconnect structures. The structure further includes a mixture of an underfill material and anisotropic filler particles embedding the array of electrical interconnect structures and located between the first and second substrates. The density of the anisotropic filler particles is uniform throughout an entirety of the mixture.

DETAILED DESCRIPTION

Figure 1:
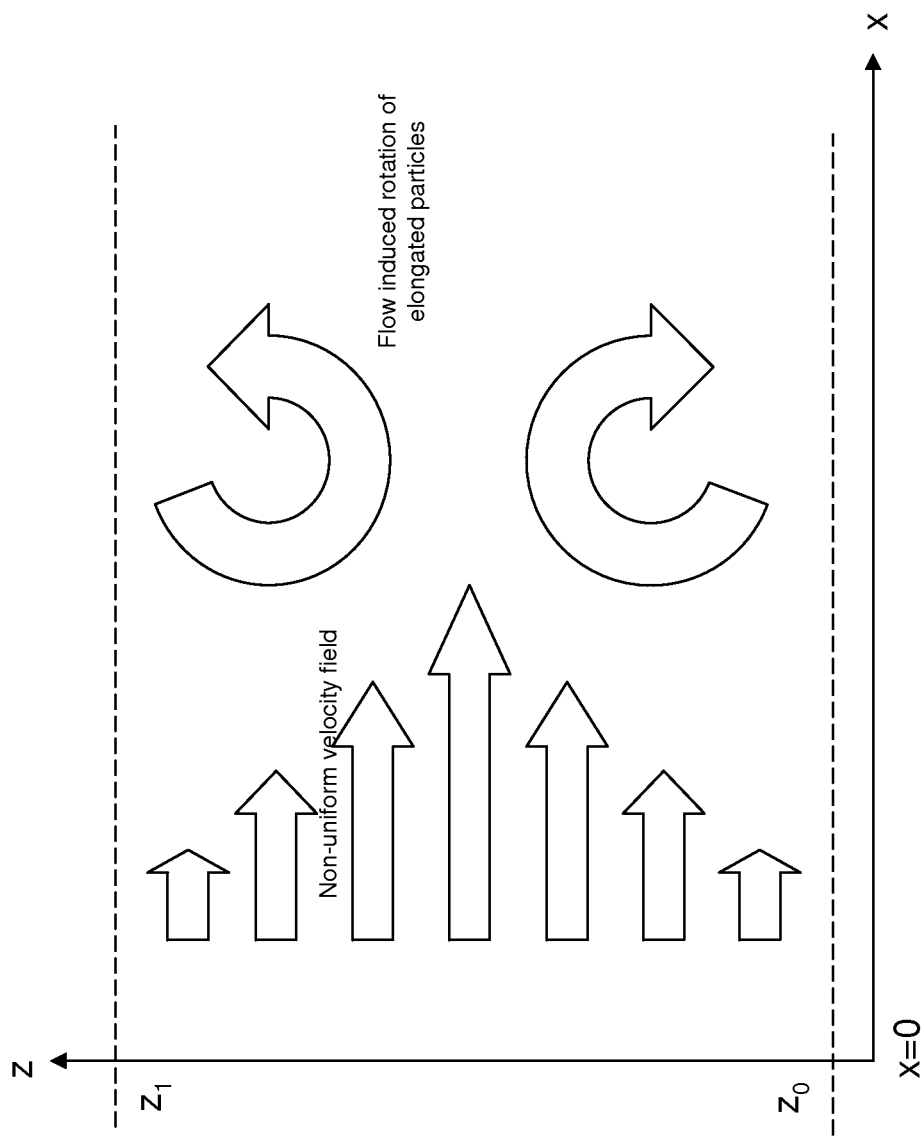
FIG. 1 is a schematic illustration of a mechanism for flow-induced rotation of particles in a fluid injected into a confined volume.
Figure 2:
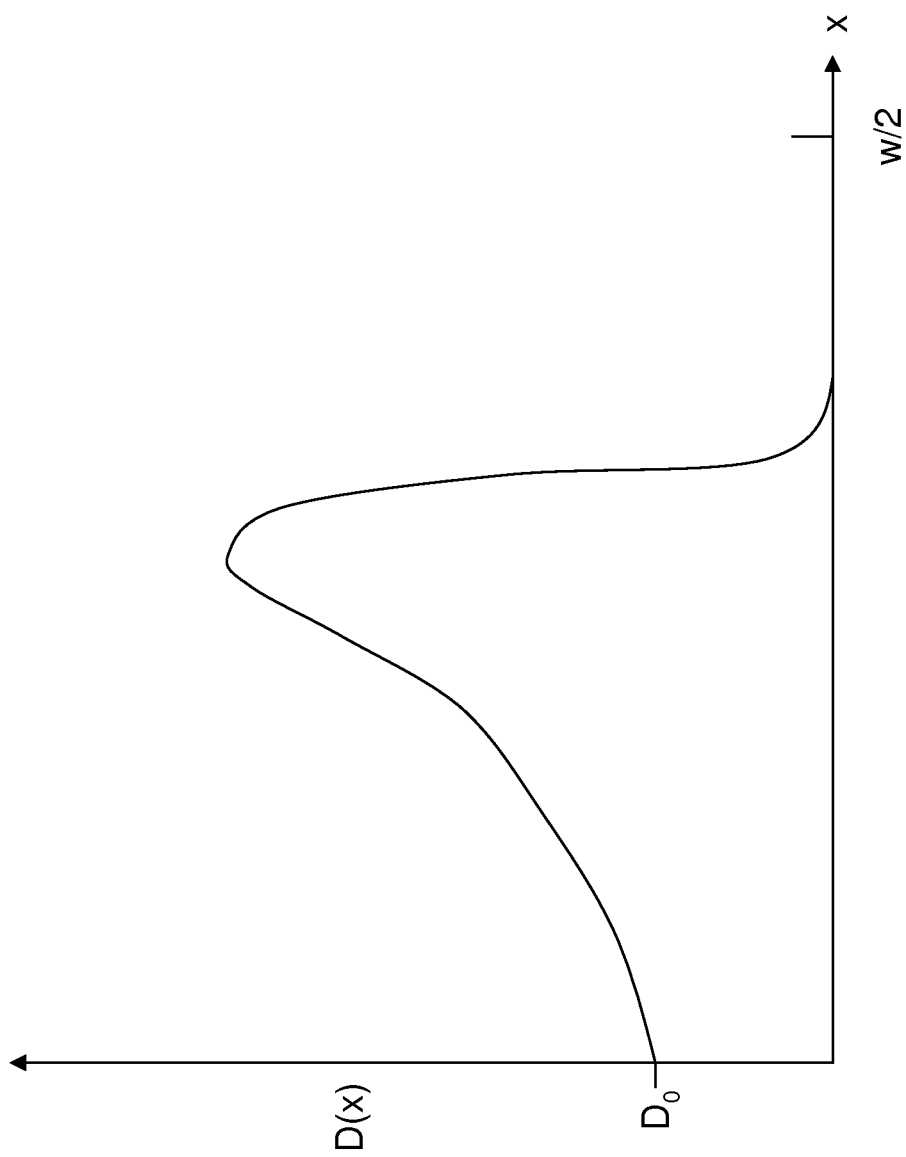
FIG. 2 is a schematic graph of a density, D(x), of elongated particles within a fluid injected into a confined volume as a function of a distance, x, from an injection point.

As stated above, the present disclosure relates to methods of dispensing a matrix material with homogeneous distribution of anisotropic filler particles through implosion, and structures generated by the same. Aspects of the present disclosure are now described in detail with accompanying figures. It is noted that like and corresponding elements are referred to by like reference numerals. The drawings are not drawn to scale.

The methods of embodiments of the present disclosure can be employed in any structure including a contiguous volume located between two surfaces and bounded by the two surfaces. The two surfaces can be oriented in a manner such that one of the two surfaces overlies the other of the two surfaces. The contiguous volume has at least one opening through which the contiguous volume is connected to the ambient in which the structure is located. For example, the contiguous volume can have at least one opening to a side in a position in which the two surfaces extend laterally. Each of the two surfaces may extend along a two-dimensional plane. In this case, each of the two surfaces may, or may not, be horizontal surfaces. The contiguous volume is a well-defined volume that does not change in time. In other words, the two surfaces are not temporary surfaces of a fluid that changes in time, but are mechanically stable surfaces of solids or liquids that do not flow within a time scale of 24 hours (as in the case of glass).

Figure 3A:
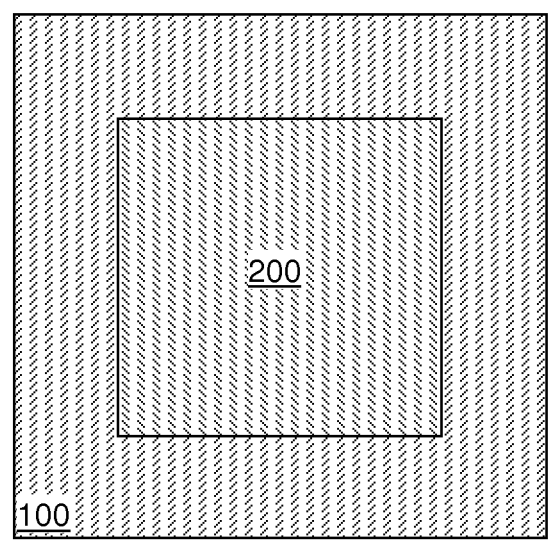
FIG. 3A is a top-down view of an exemplary bonded structure as loaded within a vacuum-tight enclosure according to an embodiment of the present disclosure.
Figure 3B:
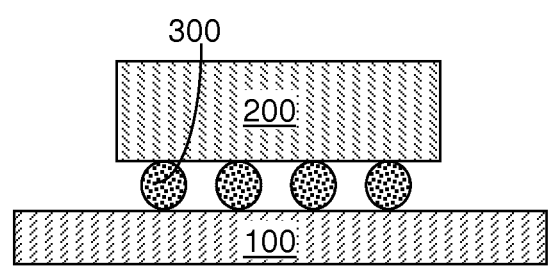
FIG. 3B is a vertical cross-sectional view of the exemplary bonded structure of FIG. 3A.

In one embodiment, the structure can be a bonded structure in which two substrates are bonded by at least one mechanical means. FIGS. 3A and 3B illustrate an exemplary bonded structure including a first substrate 100, a second substrate 200, and an array of electrical interconnect structures 300, in which the array of electrical interconnect structures 300 functions as mechanical means that hold the first and second substrates (100, 200) in place. The electrical interconnect structures 300 can be solder balls, metal-to-metal bonding structures, conductive adhesive portions, and/or any other electrical interconnection structures known in the art. A top surface of the first substrate 100 can constitute one of the two surfaces defining a boundary of the contiguous volume, and a bottom surface of the second substrate 200 can constitute the other of the two surfaces defining another boundary of the contiguous volume. The array of electrical interconnect structures 300 can be bonded to the two surfaces defining the boundaries of the contiguous volume. Further, the array of electrical interconnect structures 300 can be embedded within the contiguous volume.

If the sidewalls of the second substrate 200 are entirely within an area defined by sidewalls of the first substrate 100 as seen in a top down view such as FIG. 3A, the contiguous volume can be defined as the entirety of the space that underlies the second substrate 200, overlies the first substrate 100, and laterally bounded by a set of vertical surfaces that contact all sidewalls of the second substrate 200, less the set of spaces occupied by the array of electrical interconnect structures 300.

In one embodiment, the first substrate 100 can be a semiconductor chip, a interposer structure for mounting a semiconductor chip to another structure, or a packaging substrate such as a laminate packaging substrate or a ceramic packaging substrate. The second substrate 200 can be a semiconductor chip. The array of electrical interconnect structures 300 can be, for example, an array of C4 balls as known in the art.

A mixture of a matrix material and anisotropic filler particles is prepared. As used herein, a matrix material refers to a material having sufficient adhesion among molecules to form a contiguous structure that does not break apart spontaneously upon insertion of at least one type of foreign material. In one embodiment, the matrix material can be a viscous liquid. In one embodiment, the matrix material can be a viscous dielectric liquid. In one embodiment, the matrix material can be an underfill material. As used herein, an "underfill material" refers to an electrically-insulating adhesive material that can provide a stronger mechanical connection and/or a heat bridge between two substrates. Underfill materials for the purpose of flip chip bonding are known in the art.

As used herein, "filler particles" refer to particles that can be inserted into a matrix material without spontaneous agglomeration of the filler particles in the absence of external forces other than gravity. As used herein, "anisotropic filler particles" refers to non-spherical filler particles. In one embodiment, a maximum dimension of an anisotropic filler particle can be at least twice a minimum dimension of the anisotropic filler particle. As used herein, a "maximum dimension" of an object refers to a greatest distance between two points located on a surface of the object. As used herein, a "minimum dimension" of an object refers to a distance between a pair of saddle points separated by a least distance and located on surfaces of the object. As used herein, a "saddle point" is a point at which a distance from another point on a same object has a local maximum along one direction of the surface containing the point and has a local minimum along another direction of the surface. For example, a minimum dimension of a cylindrical rod having a greater length than a diameter is the diameter, and a maximum dimension of such as cylindrical rod is the length of the cylindrical rod. For an ellipsoid having three different major axes, the maximum dimension is the greatest major axis and the minimum dimension is the least major axis.

The anisotropy of a filler particle is herein defined as the ratio of the maximum dimension to the minimum dimension. A filler particle has an anisotropy greater than 1.0. In one embodiment, anisotropic filler particles employed in embodiments of the present disclosure can have anisotropy greater than 3. In another embodiment, anisotropic filler particles employed in embodiments of the present disclosure can have anisotropy greater than 10. In even another embodiment, anisotropic filler particles employed in embodiments of the present disclosure can have anisotropy greater than 30. In yet another embodiment, anisotropic filler particles employed in embodiments of the present disclosure can have anisotropy greater than 100. In still another embodiment, anisotropic filler particles employed in embodiments of the present disclosure can have anisotropy greater than 300. In further another embodiment, anisotropic filler particles employed in embodiments of the present disclosure can have anisotropy greater than 1000.

In one embodiment, the maximum dimension of each anisotropic filler particle can be in a range from 10 nm to 10 microns. In another embodiment, the maximum dimension of each anisotropic filler particle can be in a range from 10 nm to 100 nm. In yet another embodiment, the maximum dimension of each anisotropic filler particle can be in a range from 100 nm to 1 microns. In even another embodiment, the maximum dimension of each anisotropic filler particle can be in a range from 1 micron to 10 microns.

In one embodiment, the minimum dimension of each anisotropic filler particle can be in a range from 1 nm to 1 microns. In another embodiment, the minimum dimension of each anisotropic filler particle can be in a range from 1 nm to 10 nm. In yet another embodiment, the minimum dimension of each anisotropic filler particle can be in a range from 10 nm to 100 nm. In even another embodiment, the minimum dimension of each anisotropic filler particle can be in a range from 100 nm to 1 micron.

In general, for a mixture to be applied to a contiguous volume located between two surfaces and bounded by the two surfaces, the matrix material can be an insulator material, a semiconductor material, or a conductive material As used herein, an insulator material refers to a material having a resistivity greater than $1.0 \times 10^3$ Ohm-cm. As used herein, a semiconductor material refers to a material having a resistivity in a range from $1.0 \times 10^{-3}$ Ohm-cm to $1.0 \times 10^3$ Ohm-cm. As used herein, a conductive material refers to a material having a resistivity less than $1.0 \times 10^{-3}$ Ohm-cm. If the matrix material is an underfill material, the underfill material is an insulator material.

In general, for a mixture to be applied to a contiguous volume located between two surfaces and bounded by the two surfaces, the anisotropic filler particles can be an insulator material, a semiconductor material, or a conductive material. If the matrix material is an underfill material, the anisotropic filler particles can be an insulator material or a semiconductor material. In one embodiment, the anisotropic filler particles can include a material having thermal conductivity greater than 0.2 W/(m·K). In this case, the anisotropic filler particles can enhance transmission of heat between the first substrate 100 and the second substrate 200 after the mixture is subsequently applied into the volume between the first substrate 100 and the second substrate 200.

In one embodiment, a sonication technique can be used to initially disperse anisotropic particles into a matrix material. In another embodiment, a 3 roll mill can be used to initially disperse anisotropic particles into a matrix material. A 3 roll mill is a machine that uses shear force created by three horizontally positioned rolls rotating in opposite directions and different speeds relative to each other, in order to mix, disperse, or homogenize viscous materials fed into it. In yet another embodiment, the mixing of the anisotropic filler particles with the matrix material can be performed by mechanical mixing employing, for example, a paddle or a spatula. In the mixture, the anisotropic filler particles are homogeneously mixed within the matrix material. As used herein, a "homogenous" mixing of particles refers to a mixing of particles in a manner such that the macroscopic density of the particles is substantially the same within the entirety of a mixture including the particles. As used herein, a macroscopic density is "substantially the same" if the density does not fluctuate by more than +/−3% throughout the entirety of the volume in which the macroscopic density is measured. As used herein, a "density" of particles refers to a macroscopic average density as measured at length scales that are at least ten times greater than the maximum dimensions of the particles. For example, if the maximum dimensions of the particles are on the order of 1 micron, the density is calculated at length scales on the order of 10 microns.

In one embodiment, the anisotropic filler particles can be functionalized prior to formation of the mixture, i.e., prior to insertion into the matrix material. By functionalization, at least a portion of the surface of each anisotropic filler particle is functionally modified to retard agglomeration thereamongst. In one embodiment, the anisotropic filler particles can be functionalized employing intermolecular forces derived from covalent bonds. In this case, functional groups or radicals such as —OH, —COOH, —F, and a polyethylene glycol functional group. In another embodiment, the anisotropic filler particles can be functionalized employing intermolecular forces that are not derived from covalent bonds. In this case, the anisotropic filler particles can be functionalized, for example, employing van der Waals force. Alternately or additionally, the anisotropic filler particles can be functionalized employing surfactants and/or polymer wrapping.

The volume fraction of the anisotropic filler particles within the matrix material is selected so that the matrix material forms a single contiguous structure extending through the entirety of the mixture. In one embodiment, the volume fraction of the anisotropic fillers can be less than 0.1 within the mixture. In another embodiment, the volume fraction of the anisotropic fillers can be less than 0.03 within the mixture. In yet another embodiment, the volume fraction of the anisotropic fillers can be less than 0.01 within the mixture. In even another embodiment, the volume fraction of the anisotropic fillers can be less than 0.003 within the mixture. In still another embodiment, the volume fraction of the anisotropic fillers can be less than 0.001 within the mixture.

In one embodiment, the anisotropic filler particles can be provided within the matrix material in such a quantity that forms a network of percolation paths. As used herein, a "percolation path" refers to a set of physically contacting particles that contiguously extend from one end of a matrix to an opposite end of a matrix. For example, a percolation path of anisotropic filler particles exist within a matrix material if there exists a set of physically contacting anisotropic filler particles that contiguously extend from one end of a container including the matrix material to an opposite end of the container.

In one embodiment, the anisotropic filler particles can be an elongated structure extending predominantly along one direction and extending less at least by a factor of 3 along two other orthogonal directions. In other words, the length of the anisotropic filler particles can be greater than any other dimension perpendicular to the lengthwise direction at least by a factor of 3. For example, the anisotropic filler particles can be a nanowire or a nanofiber. As used herein, a nanowire refers to a wire having a diameter or an equivalent dimension (such as a minor axis of an ellipse in a cross-sectional shape) that is not less than 1 nm and less than 1 micron. As used herein, a nanofiber refers to a fiber having a diameter or an equivalent dimension (such as a minor axis of an ellipse in a cross-sectional shape) that is not less than 1 nm and less than 1 micron. In one embodiment, the anisotropic filler particles are selected from silicon carbide nanowires, halloysite nanowires, nanowires of at least one metallic material, carbon nanotubes, polymer nanofibers, and combinations thereof.

In one embodiment, the anisotropic filler particles can be a substantially planar structure extending predominantly along two mutually orthogonal directions and extending less at least by a factor of 3 along a third direction that is orthogonal to the two mutually orthogonal directions. For example, the anisotropic filler particles can be a platelet, i.e., a structure that resembles a plate. In one embodiment, the anisotropic filler particles can be platelets of a material selected from graphene, graphene oxide, boron nitride, a mineral silicate (which is also known as "nanoclay"), and combinations thereof.

An apparatus including a vacuum-tight enclosure, a vacuum pump, and a device for abruptly breaking the vacuum within the vacuum-tight enclosure by introduction of a gas is employed. The structure including a contiguous volume located between two surfaces and bounded by the two surfaces is loaded into the vacuum-tight enclosure. As used herein, a vacuum-tight enclosure refers to any enclosure that includes a vacuum environment and maintaining the vacuum environment until an implosion step is subsequently performed. As used herein, a vacuum environment refers to any environment having a total pressure less than 1 Torr, which is about 1/760 of the atmospheric pressure. Typically, a vacuum-tight enclosure is capable of holding a vacuum environment for a duration of at least 1 hour, during which a step for dispensation of the mixture and a step of implosion can be performed. In one embodiment, the vacuum-tight enclosure can have a sealable opening (such as a door) through which the structure including the contiguous volume between two surfaces can be loaded into the inside of the vacuum-tight enclosure while the inside of the vacuum-tight enclosure is at atmospheric pressure.

Subsequently, the inside of the vacuum-tight enclosure is pumped down to a vacuum environment, for example, employing a vacuum pump. The lowest pressure that the inside of the vacuum-tight enclosure can be pumped down is herein referred to as a base pressure. In one embodiment, the vacuum-tight enclosure can have a base pressure in a range from $1.0 \times 10^{-6}$ Torr to 1 Torr. In one embodiment, the vacuum environment can have a pressure less than 1 Torr after pumping. In another embodiment, the vacuum environment can have a pressure less than $1 \times 10^{-1}$ Torr after pumping. In even another embodiment, the vacuum environment can have a pressure less than $1 \times 10^{-2}$ Torr after pumping. In yet another embodiment, the vacuum environment can have a pressure less than $1 \times 10^{-3}$ Torr after pumping. In still another embodiment, the vacuum environment can have a pressure less than $1 \times 10^{-4}$ Torr after pumping.

Figure 4A:
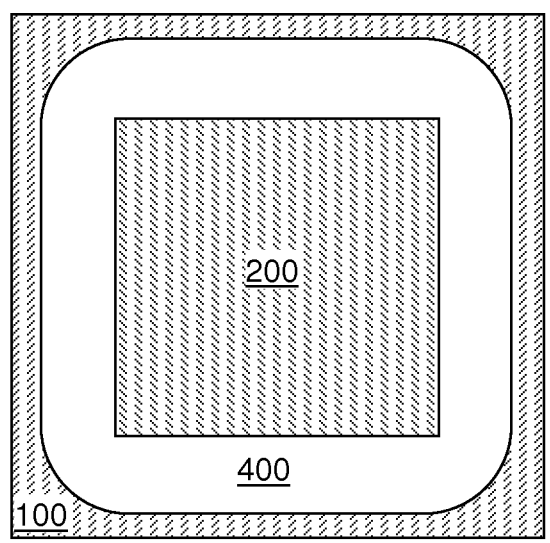
FIG. 4A is a top-down view of the exemplary bonded structure after application of a mixture of an underfill material and anisotropic filler particles according to an embodiment of the present disclosure.
Figure 4B:
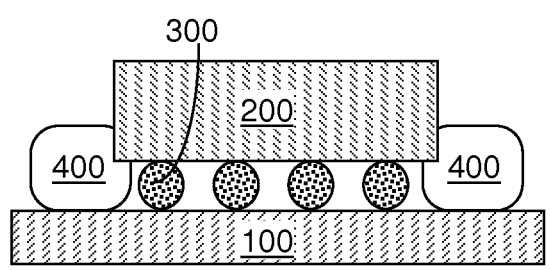
FIG. 4B is a vertical cross-sectional view of the exemplary bonded structure of FIG. 4A.
Figure 5:
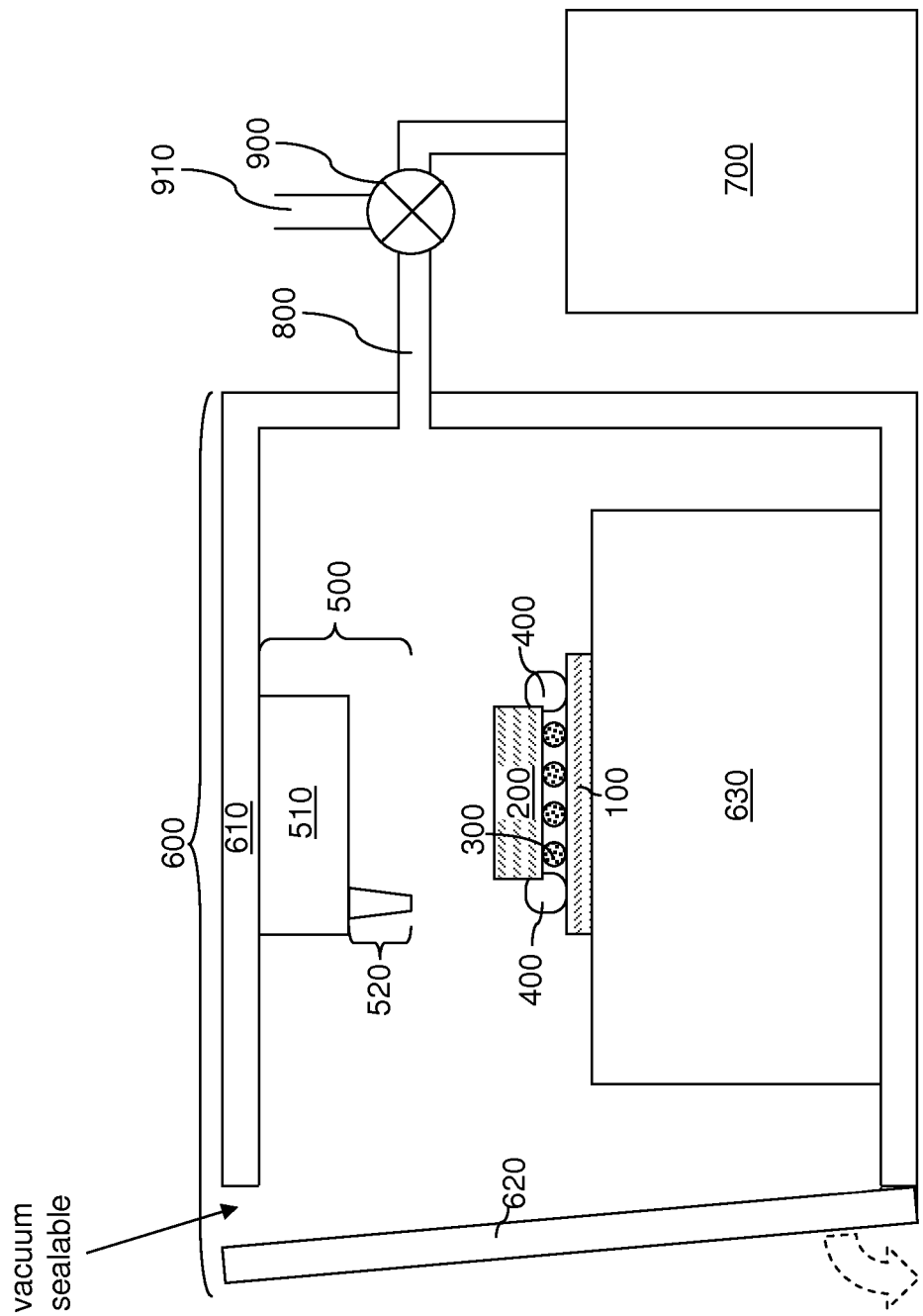
FIG. 5 is a vertical cross-sectional view of the exemplary bonded structure of FIG. 4A as loaded into a vacuum-tight enclosure according to an embodiment of the present disclosure.

Referring to FIGS. 4A, 4B, and 5, an exemplary bonded structure (100, 200, 300) as loaded into an apparatus including a vacuum-tight enclosure 600 is schematically illustrated. The vacuum-tight enclosure 600 includes enclosure walls 610 and an enclosure door 620, which collectively define the boundary of the vacuum environment to be formed within the vacuum-tight enclosure 600. A pedestal 630 can be provided within the vacuum-tight enclosure 600 in order to facilitate placement of the exemplary bonded structure (100, 200, 300).

The vacuum-tight enclosure 600 is equipped with a dispensation device 500. The dispensation device 500 can include a dispensation material tank 510 and a movable dispenser 520. The exemplary bonded structure (100, 200, 300) can be loaded onto the pedestal 630 such that the movable dispenser 520 overlies the exemplary bonded structure (100, 200, 300).

Prior to pumping down of the inside of the vacuum-tight enclosure 600, the dispensation material tank 510 is filled with the mixture of the matrix material and the anisotropic filler materials. The movable dispenser 520 is configured to move around laterally, and change the location at which the mixture is dispensed. In one embodiment, the initiation and termination of dispensation of the mixture and the lateral movement of the movable dispenser 520 can be controlled by an automated program that is run on a dispensation control computer (not shown). Structures (such as rails or wires) configured to guide the lateral movement of the movable dispenser 520 can be provided underneath the dispensation material tank.

The apparatus can include a vacuum pump 700, a vacuum manifold 800, a configuration-switching device 900, and a gas inlet 910. The vacuum manifold 800 connects the inside of the vacuum-tight enclosure 600 to the vacuum pump 700 through the configuration-switching device 900. The configuration-switching device 900 changes the configuration of the vacuum manifold 800 between a first configuration and a second configuration. In the first configuration, the vacuum manifold 800 connects the inside of the vacuum-tight enclosure 600 to the vacuum pump 700, while the gas inlet 910 is isolated from the inside of the vacuum-tight enclosure 600. In the second configuration, the vacuum manifold connects the inside of the vacuum-tight enclosure 600 to the gas inlet 910, while the vacuum pump 700 is isolated from the inside of the vacuum-tight enclosure 600. The gas inlet 910 can be connected to an air ambient, or can be connected to a source of an inert gas such as nitrogen or argon.

While the configuration-switching device 900 is in the first configuration, the inside of the vacuum-tight enclosure 600 is pumped down to a vacuum environment. After the inside of the vacuum-tight enclosure 600 is pumped down to a vacuum environment, e.g., after the inside of the vacuum-tight enclosure reaches the base pressure, the mixture in the dispensation material tank 510 is dispensed onto a periphery of the contiguous volume located between two surfaces and bounded by the two surfaces. For example, the mixture in the dispensation material tank 510 is dispensed onto a periphery of the exemplary bonded structure (100, 200, 300).

The mixture is applied in vacuo, i.e., within the vacuum environment, around a periphery of the contiguous volume and on at least one of the two surfaces. Thus, a dispensed mixture portion is formed around the periphery of the contiguous volume and on at least one of the two surfaces. In one embodiment, the applied mixture can be an underfill material. In this case, an underfill material mixture portion 400 can be formed around the periphery of the contiguous volume defined by the first and second substrates (100, 200). The underfill material mixture portion 400 is a portion of a mixture of an underfill material and anisotropic filler particles. The contiguous volume is the volume embedding the array of electrical interconnect structures 300, overlying the first substrate 100, underlying the second substrate 200, and laterally bounded within vertical planes defined by the sidewalls of the second substrate 200.

The dispensed mixture portion can be formed on at least one of the two surfaces by which the contiguous volume is bound. In one embodiment, the underfill material mixture portion 400 can be formed directly on the top surface of the first substrate 100 and the sidewalls of the second substrate 200. The location of the movable dispenser 520 and the rate of dispensation can be controlled so that the underfill material mixture portion 400 seals the contiguous volume. In that case, the applied mixture can seal the contiguous volume, and the contiguous volume can become an encapsulated volume that is separated from an ambient vacuum by the applied mixture. As used herein, an "encapsulated" volume refers to a volume that is physically bounded entirely by non-gaseous materials and not contiguously connected to any other volume under vacuum or any other volume filled with at least one gas. In one embodiment, the applied mixture can be the underfill material mixture portion 400 that defines an encapsulated volume in which the array of electrical interconnect structures 300 is embedded.

Figure 6A:
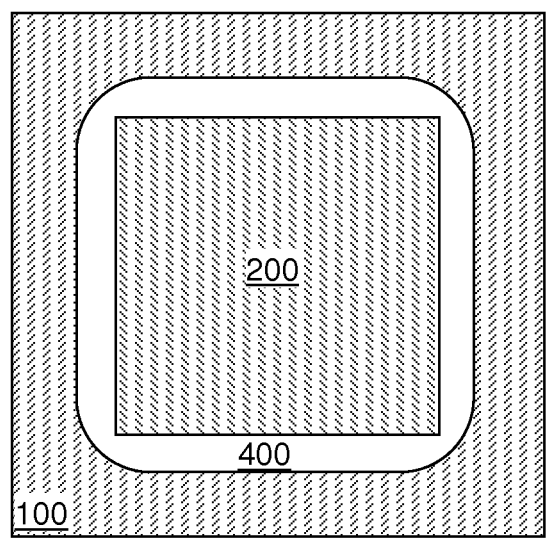
FIG. 6A is a top-down view of the exemplary bonded structure after distribution of the mixture of the underfill material and the anisotropic filler particles within the space between substrates according to an embodiment of the present disclosure.
Figure 6B:
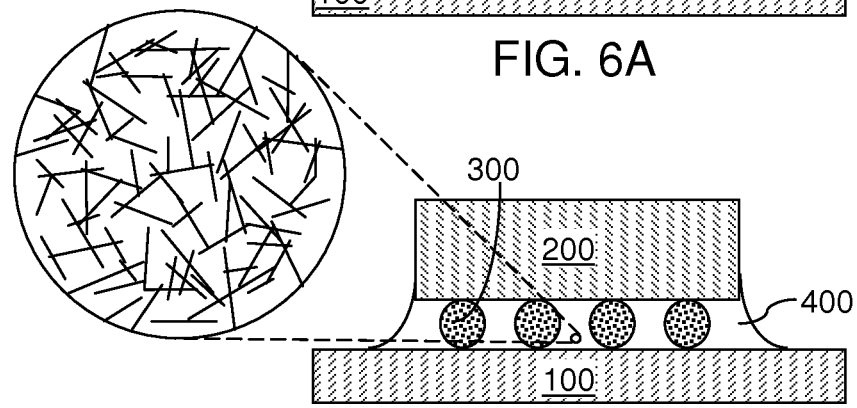
FIG. 6B is a vertical cross-sectional view of the exemplary bonded structure of FIG. 6A.

Referring to FIGS. 6A and 6B, the configuration-switching device 900 is subsequently activated to change the setting from the first configuration to the second configuration. An ambient gas abruptly flows into the vacuum-tight enclosure 600 to cause an implosion of the encapsulated volume, and to push the applied mixture, e.g., the underfill material mixture portion 400, toward a geometrical center of the encapsulated volume as previously defined by the underfill material mixture portion 400 (prior to the implosion). Through implosion, the mixture of the underfill material and the anisotropic filler particles is distributed within the space between first and second substrates (100, 200). A high shear stress flow applied during the vacuum implosion breaks up aggregates while also preventing aggregation because the applied force is greater than interparticle attractive force. Thus, any aggregates of anisotropic filler particles are broken up, while formation of aggregates of the anisotropic filler particles is prevented during the vacuum implosion.

The applied mixture is imploded into the continuous volume by introduction of a gas into the enclosed volume within the vacuum-tight enclosure 600. The introduced gas can be air, dried air, oxygen, nitrogen, argon, or any other inert gas. In one embodiment, the introduction of the gas can occur on a time scale of less than 1 second. In one embodiment, the introduction of the gas can occur on a time scale of 1 millisecond to 100 milliseconds. The pressure differential between the ambient pressure at the gas inlet 910 and the inside of the vacuum-tight enclosure 600 is at least 759 Torr, and can be greater than 759.9 Torr.

In one embodiment, the implosion induces movement of the applied mixture with a peak acceleration greater than 9.8 m/sec$^2$, i.e., at a peak acceleration greater than average gravitational pull of the earth. In another embodiment, the implosion induces movement of the applied mixture with a peak acceleration greater than three times the average gravitational pull of the earth. In yet another embodiment, the implosion induces movement of the applied mixture with a peak acceleration greater than ten times the average gravitational pull of the earth. In still another embodiment, the implosion induces movement of the applied mixture with a peak acceleration greater than thirty times the average gravitational pull of the earth.

It is noted that in a typical capillary underfill process known in the art, the pressure drop is between 100 Pa and 1000 Pa. In the case of vacuum implosion, the pressure drop is on the order of $10^5$ Pa, which is about two orders of magnitude greater than the pressure employed in capillary underfill process.

In one embodiment, a pressure greater than atmospheric pressure can be employed if the ambient pressure is greater than 760 Torr. In this case, the ambient can be provided within a pressurized vessel containing the apparatus of the present disclosure. Further, a pressure less than the atmospheric pressure can be employed if the ambient pressure is less than 760 Torr. In this case, the ambient can be in a reduced pressure vessel containing the apparatus of the present disclosure. In one embodiment, the ambient pressure can be in a range from 0.1 atm. to 10 atm., i.e., from 0.1 times 760 Torr to 10 times 760 Torr.

In one embodiment, the amount of the applied mixture can be controlled such that imploded mixture has a contiguous surface contacting the first substrate at a first periphery and contacting the second substrate at a second periphery. Each of the first periphery and the second periphery can have a closed shape. In one embodiment, if the applied mixture is an underfill material mixture portion 400 applied around an array of electrical interconnect structures 300 that bond a first substrate 100 to the second substrate 200, the first periphery can be formed on a planar top surface of the first substrate 100, and the second periphery can be formed on sidewalls of the second substrate 200 as illustrated in FIG. 6B.

The implosion of the applied mixture distributes the applied mixture within the contiguous volume employing a completely different mechanism than injection of fluid discussed above. Notably, the high shear stress breaks up aggregates while also preventing aggregation because the applied force is greater than interparticle attractive forces. Thus, the introduced gas causes the applied mixture to fill the contiguous volume with a homogeneous distribution of the anisotropic filler particles within the matrix material.

In one embodiment, the anisotropic filler particles form a network of percolation paths after filling the contiguous volume. In one embodiment, the imploded mixture can be an underfill material mixture portion 400 that fills the entirety of the space previously occupied by the enclosed volume between the first substrate 100 and the second substrate 200. In this case, the anisotropic filler particles forming a network of percolation paths can be thermal conductors that provide thermal conduction paths. The presence of the network of percolation enhances the overall thermal conductivity of the imploded mixture.

In one embodiment, a network of percolation paths can be formed even when the volume fraction of the anisotropic filler particles can be less than 0.1 within the mixture after the implosion. An inset in FIG. 6B illustrates presence of a network of percolation paths in a middle portion of the imploded underfill material mixture portion 400.

In one embodiment, the exemplary bonded structure after implosion of the mixture can include a first substrate 100 and a second substrate 200 that are bonded to each other through an array of electrical interconnect structures 300, and a underfill material mixture portion 400. The underfill material mixture portion 400 is a mixture of an underfill material and anisotropic filler particles embedding the array of electrical interconnect structures 300 and located between the first and second substrates (100, 200). The density of the anisotropic filler particles is uniform throughout an entirety of the mixture, i.e., the underfill material mixture portion 400.

In one embodiment, the imploded mixture has a contiguous surface contacting the first substrate 100 at a first periphery having a closed shape, and contacting the second substrate 200 at a second periphery having another closed shape. The first periphery can have a shape of a rounded rectangle, i.e., a shape derived from a rectangle by rounding the four corners. The first periphery can be formed on a planar top surface of the first substrate 100, and the second periphery can be formed on sidewalls of the second substrate 200. The second periphery can have a shape of four lines adjoined among one another and located within a set of four vertical planes defining the sidewalls of the second substrate 200.

In one embodiment, the underfill material and the anisotropic filler particles can include insulator materials. In one embodiment, the anisotropic filler particles can be selected from silicon carbide nanowires, halloysite nanowires, nanowires of at least one metallic material, carbon nanotubes, polymer nanofibers, and platelets of a material selected from graphene, graphene oxide, boron nitride, and a thermoplastic material.

The methods according to the various embodiments of the present disclosure can be employed to fill a contiguous volume in which a mixture of a matrix material and anisotropic filler particles are not formed, but into which such a mixture is applied. Unlike previously known methods of inducing a flow of the mixture that necessarily triggered agglomeration of the anisotropic filler particles, the vacuum implosion method of the embodiments of the present disclosure can avoid agglomeration of the anisotropic filler particles, thereby enabling a homogeneous distribution of the anisotropic filler particles throughout the entirety of the imploded mixture. Further, the homogeneous nature of the density of the anisotropic filler particles enables use of a lesser volume fraction of the anisotropic filler particles compared to prior art attempts, while providing a greater structural integrity and/or thermal conductivity and/or electrical conductivity because a network of percolation paths can be formed throughout the entirety of the imploded mixture. The density of the anisotropic filler particles is the same throughout the entirety of the network of the percolation paths. In other words, the density of physical contacts among anisotropic filler particles is the same throughout the entirety of the imploded mixture.

The anisotropic filler particles of the various embodiments of the present disclosure may be employed in conjunction with isotropic (spherical) filler particles. In this case, the matrix includes anisotropic filler particles and isotropic filler particles. In this case, the benefits of an isotropic system (which can pack very high volume fractions of isotropic filler particles without flow consideration) and the benefits of an anisotropic system can be achieved at optimum levels. The major benefit of a high volume fraction filler is that one can dramatically change properties that scale strongly with volume fraction such as coefficient of thermal expansion (CTE), dielectric constant, and modulus.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of disposing a mixture of a matrix material and anisotropic filler particles into a volume, said method comprising:
   providing a structure including a contiguous volume located between two surfaces and bounded by said two surfaces vertically spaced from each other;
   providing a mixture of a matrix material and non-spherical anisotropic filler particles that are homogeneously mixed within said matrix material;
   disposing said structure within a vacuum-tight enclosure;
   providing a vacuum environment within said vacuum-tight enclosure while said structure is present within said vacuum-tight enclosure;
   applying said mixture within said vacuum environment around a periphery of said contiguous volume and on at least one of said two surfaces of said structure; and
   imploding said applied mixture into said contiguous volume by abrupt application of a gas into said vacuum-tight enclosure while maintaining said vacuum environment, wherein said abrupt application of said gas occurs for a total duration of less than 1 second, and wherein said application of gas causes said applied mixture to fill said contiguous volume with a homogeneous distribution of said non-spherical anisotropic filler particles within said matrix material.

2. The method of claim 1, wherein said structure comprises:
   a first substrate including one of said two surfaces;
   a second substrate including another of said two surfaces; and
   an array of electrical interconnect structures bonded to said two surfaces, wherein said contiguous volume embeds said array of electrical interconnect structures.

3. The method of claim 2, wherein said matrix material is an underfill material.

4. The method of claim 2, wherein said imploded mixture has a contiguous surface contacting said first substrate at a first periphery having a closed shape and contacting said second substrate at a second periphery having another closed shape.

5. The method of claim 4, wherein said first periphery is formed on a planar top surface of said first substrate, and said second periphery is formed on sidewalls of said second substrate.

6. The method of claim 2, wherein said matrix material and said non-spherical anisotropic filler particles comprise an insulator material or a semiconductor material.

7. The method of claim 1, wherein said non-spherical anisotropic filler particles form a network of percolation paths after filling said contiguous volume.

8. The method of claim 1, wherein said non-spherical anisotropic filler particles comprise a material having thermal conductivity greater than 0.2 W/(m·K).

9. A method of disposing a mixture of a matrix material and anisotropic filler particles into a volume, said method comprising:
   providing a structure including a contiguous volume located between two surfaces and bounded by said two surfaces vertically spaced from each other;
   providing a mixture of a matrix material and non-spherical anisotropic filler particles that are homogeneously mixed within said matrix material;
   disposing said structure within a vacuum-tight enclosure;
   providing a vacuum environment within said vacuum-tight enclosure while said structure is present within said vacuum-tight enclosure;
   applying said mixture within said vacuum environment around a periphery of said contiguous volume and on at least one of said two surfaces of said structure; and
   imploding said applied mixture into said contiguous volume by abrupt application of a gas into said vacuum-tight enclosure while maintaining said vacuum environment, wherein said abrupt application of said gas occurs for a total duration of less than 1 second and said abrupt application of said gas induces movement of said applied mixture with a peak acceleration greater than 9.8 m/sec$^2$, and wherein said application of gas causes said applied mixture to fill said contiguous volume with a homogeneous distribution of said non-spherical anisotropic filler particles within said matrix material.

10. The method of claim 1, wherein said applied mixture seals said contiguous volume so that said contiguous volume becomes an encapsulated volume that is separated from an ambient vacuum by said applied mixture.

11. The method of claim 1, wherein said non-spherical anisotropic filler particles are selected from silicon carbide nanowires, halloysite nanowires, nanowires of at least one metallic material, carbon nanotubes, polymer nanofibers, and combinations thereof.

12. The method of claim 1, wherein said non-spherical anisotropic filler particles are platelets of a material selected from graphene, graphene oxide, boron nitride, a thermoplastic material, and combinations thereof.

13. The method of claim 1, further comprising functionalizing said non-spherical anisotropic filler particles to retard agglomeration prior to forming said mixture of said matrix material and said non-spherical anisotropic filler particles.

14. The method of claim 1, wherein said non-spherical anisotropic filler particles have a ratio of a maximum dimension to a minimum dimension that is greater than 3.0.

15. The method of claim 1, wherein said non-spherical anisotropic filler particles have a volume fraction less than 0.1 within said mixture after said implosion.

16. The method of claim 1, wherein said abrupt application of said gas occurs for duration of between 1 millisecond and 100 milliseconds.

\* \* \* \* \*